April 6, 1965 A. H. J. N. VAN DIJKUM ETAL 3,177,454
CIRCUIT ARRANGEMENT FOR DETUNING A CIRCUIT BY MEANS OF A SEMI-CONDUCTOR BLOCKING DIODE
Filed Sept. 6, 1960
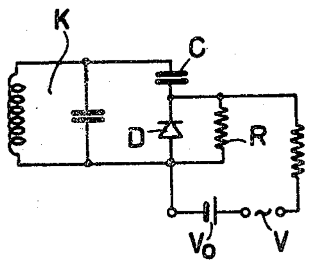
INVENTOR
Adalbertus H. J. Nieveen van Dijkum
Cornelis de Vries
BY
Frank R. Jifari
AGENT

United States Patent Office 3,177,454

Patented Apr. 6, 1965

3,177,454

CIRCUIT ARRANGEMENT FOR DETUNING A CIRCUIT BY MEANS OF A SEMI-CONDUCTOR BLOCKING DIODE

Adalbertus Hermanus Jacobus Nieveen van Dijkum and Cornelis de Vries, both of Nijmegen, Netherlands, assignors to North American Philips Company, Inc., New York, N.Y., a corporation of Delaware

Filed Sept. 6, 1960, Ser. No. 53,947
Claims priority, application Germany, Sept. 17, 1959, N 17,257
2 Claims. (Cl. 334—15)

The invention relates to a circuit arrangement for detuning a circuit by means of a semi-conductor diode, driven in the reverse direction and controlled by a control-voltage. Such arrangements are used, for example, for the readjustment or for the modulation of the frequency of an oscillator. Such arrangements give rise to a problem in that the diode has, not only, a capacity varying with the control-voltage, but also an internal resistance varying with the control-voltage. This produces a variable damping of the resonant circuit, which damping varies with the amplitude modulation of the oscillations produced across the circuit.

The invention mitigates this disadvantage and is characterized in that the diode, shunted by a resistance of a suitable value, in series with a capacitor, is connected in parallel with the resonant circuit, which capacitor has a value such that the damping variation of the circuit is minimized.

The invention will be described more fully with reference to a drawing, which illustrates one embodiment.

In the drawing the resonant circuit is designated by K. This circuit may be the frequency-determining circuit of an oscillator, of which the frequency is to be readjusted or modulated, or the circuit may be used in amplifiers having a variable tuning but a constant matching.

In parallel with the resonant circuit K is connected the series combination of a capacitor C and a diode D, shunted by a resistor R. The diode D is a semi-conductor diode and is biased in the reverse direction by a bias-voltage source $V_0$. In series with this bias voltage source $V_0$ is connected a control-voltage source V.

It is known that the internal capacity of the diode D varies in inverse proportion to the root of the applied voltage. However, it has been found that also the internal resistance of the diode varies with the applied voltage, so that a variable damping could occur in parallel with the circuit K. By providing the capacitor C and the resistor R, in accordance with the invention, and by suitable proportioning of these circuit elements the variation of this damping can be minimized. To this end the following relation should be fulfilled, approximately:

$$\omega^2 C^2 R R_d = \frac{C - C_g}{C_g}$$

wherein R designates the value of the resistor, C the capacity of the capacitor, $\omega$ the mean angular frequency of the resonant circuit, $R_d$ the internal blocking resistance of the diode and $C_g$ the mean capacity o fthe series combination of the capacitor and of the internal capacity of the diode.

What is claimed is:

1. A circuit for providing a variable reactance between first and second terminals comprising a capacitor and a semiconductor diode connected in series between said terminals, resistance means connected in parallel with said diode, means applying a variable reverse bias to said diode and means applying an oscillation between said terminals, the characteristics of said diode, capacitor, and resistance means being related substantially by the equation:

$$\omega^2 C^2 R R_d = \frac{C - C_g}{C_g}$$

wherein C is the capacitance of said capacitor, R is the resistance of said resistor, $R_d$ is the internal blocking resistance of said diode, $C_g$ is the mean series capacitance of said diode and capacitor, and $\omega$ is the angular frequency of said oscillation.

2. A resonant circuit having first and second terminals, and means for tuning said resonant circuit comprising a capacitor and a semiconductor diode serially connected between said first and second terminals, a resistor connected in parallel with said diode, a source of bias voltage connected to said diode to provide a reverse bias and control voltage means connected to said diode, said resistor, capacitor and diode satisfying the relationship:

$$\omega^2 C^2 R R_d = \frac{C - C_g}{C_g}$$

wherein C is the capacitance of said capacitor, R is the resistance of said resistor, $R_d$ is the internal blocking resistance of said diode, $C_g$ is the mean capacity of the series combination of said capacitor and diode, and $\omega$ is the angular resonant frequency of said resonant circuit.

References Cited by the Examiner

UNITED STATES PATENTS 2,182,377 12/39 Guanella.
2,330,499 9/43 Lehfeldt.

FOREIGN PATENTS 1,040,086 10/58 Germany.

HERMAN KARL SAALBACH, *Primary Examiner.*
SAMUEL B. PRITCHARD, *Examiner.*